United States Patent [19]
Carter et al.

[11] Patent Number: 6,111,323
[45] Date of Patent: Aug. 29, 2000

[54] REWORKABLE THERMOPLASTIC ENCAPSULANT

[75] Inventors: Kenneth Raymond Carter, San Jose; Craig Jon Hawker, Los Gatos; James Lupton Hedrick, Pleasanton; Robert Dennis Miller, San Jose, all of Calif.; Michael Anthony Gaynes, Vestal; Stephen Leslie Buchwalter, Hopewell Junction, both of N.Y.

[73] Assignee: International Business Machines Corporation, Armonk, N.Y.

[21] Appl. No.: 09/000,754

[22] Filed: Dec. 30, 1997

[51] Int. Cl.[7] .................................................. H01L 23/28
[52] U.S. Cl. .................... 257/787; 257/788; 257/792; 257/778
[58] Field of Search ................................... 257/737, 738, 257/778, 788, 792, 787

[56] References Cited

U.S. PATENT DOCUMENTS

| | | |
|---|---|---|
| 3,801,880 | 4/1974 | Harada et al. . |
| 3,864,426 | 2/1975 | Salensky . |
| 4,012,832 | 3/1977 | Crane . |
| 4,370,292 | 1/1983 | Yanase et al. . |
| 4,529,755 | 7/1985 | Nishikawa et al. . |
| 4,604,444 | 8/1986 | Donnadieu et al. . |
| 4,626,556 | 12/1986 | Nozue et al. . |
| 4,632,798 | 12/1986 | Eickman et al. . |
| 4,663,190 | 5/1987 | Fujita et al. . |
| 4,729,062 | 3/1988 | Anderson et al. . |
| 4,738,892 | 4/1988 | Canova . |
| 4,983,683 | 1/1991 | Shimp . |
| 4,985,751 | 1/1991 | Shiobara et al. . |
| 5,037,779 | 8/1991 | Whalley et al. . |
| 5,043,211 | 8/1991 | Yoshizumi et al. . |
| 5,061,657 | 10/1991 | Queen et al. . |
| 5,064,895 | 11/1991 | Köhler et al. . |
| 5,072,874 | 12/1991 | Bertram et al. . |
| 5,120,678 | 6/1992 | Moore et al. . |
| 5,128,204 | 7/1992 | Charmot . |
| 5,140,068 | 8/1992 | Siebert et al. . |

(List continued on next page.)

FOREIGN PATENT DOCUMENTS

| | | |
|---|---|---|
| 0 051 165 | 5/1982 | European Pat. Off. . |
| 0 169 066 | 1/1986 | European Pat. Off. . |
| 0 382 575 | 8/1990 | European Pat. Off. . |

OTHER PUBLICATIONS

Chan, K. P., "Cyclic Aryl Ethers: New Intermediates for High Performance Polymers", *Department of Chemistry*, McGill University, (Apr. 1995).

Frechet, J. M. J. et al., "Synthesis and Properties of Dendrimers and Hyperbranched Polymers", Cornell University and IBM Almaden Research Center, pp. 71–132.

Srinivasan, S. et al., "Heterocycle–Activated Aromatic Nucleophilic Substitution of $AB_2$ Poly(aryl ether phenylquinoxaline) Monomers. 3", *Macromolecules*, 29(26): 8543–8545 (1996).

Srinivasan, S. et al., "Poly(Aryl Ether Phenylquinoxalines) via Anionic Ring Opening Polymerization of Macrocycles", *Macromol. Symp.*, 122, 101–109 (1997).

Tummala, R. et al., "Chip–To–Package Interconnections", *Microelectronics Packaging Handbook Part II, Second Edition*, pp. 132–184 (1997).

*Primary Examiner*—Roy Potter
*Attorney, Agent, or Firm*—Scully, Scott, Murphy & Presser; Daniel P. Morris

[57] ABSTRACT

The invention is an encapsulated circuit assembly including a chip; a substrate; at least one solder joint which spans between the chip and the substrate forming an electrically conductive connection between the chip and the substrate; and an encapsulant formed adjacent the solder joint, wherein the encapsulant comprises a thermoplastic polymer formed by ring opening polymerization of a cyclic oligomer.

10 Claims, 1 Drawing Sheet

U.S. PATENT DOCUMENTS

| | | |
|---|---|---|
| 5,160,786 | 11/1992 | Nakai . |
| 5,199,163 | 4/1993 | Ehrenberg et al. . |
| 5,250,848 | 10/1993 | Christie et al. . |
| 5,264,520 | 11/1993 | Mullins et al. . |
| 5,274,913 | 1/1994 | Grebe et al. . |
| 5,286,572 | 2/1994 | Clodgo et al. . |
| 5,298,548 | 3/1994 | Shiobara et al. . |
| 5,300,625 | 4/1994 | Helmreich et al. . |
| 5,313,365 | 5/1994 | Pennisi et al. . |
| 5,326,413 | 7/1994 | Esemplare et al. . |
| 5,371,328 | 12/1994 | Gutierrez et al. . |
| 5,381,304 | 1/1995 | Theroux et al. . |
| 5,434,751 | 7/1995 | Cole, Jr. et al. . |
| 5,457,149 | 10/1995 | Hall et al. . |
| 5,460,767 | 10/1995 | Sanftleben et al. . |
| 5,471,096 | 11/1995 | Papathomas et al. . |
| 5,474,620 | 12/1995 | Nath et al. . |
| 5,498,689 | 3/1996 | Furuta et al. . |
| 5,821,456 | 10/1998 | Wille et al. ............................ 174/52.2 |
| 5,863,664 | 1/1999 | McCormick et al. .................. 428/500 |

REWORKABLE THERMOPLASTIC ENCAPSULANT

FIELD OF THE INVENTION

The invention relates generally to thermoplastic reworkable encapsulants for integrated circuit assemblies. More specifically, the invention relates to reworkable encapsulants for integrated circuits which comprise high molecular weight polymers synthesized by the ring opening polymerization of low molecular weight cyclic oligomers.

BACKGROUND OF THE INVENTION

Integrated circuit components are often encapsulated to maintain structural and functional integrity. In many instances, the encapsulant is a cured polymer. The attributes of curable polymers include the combination of processability prior to curing with outstanding properties after curing. Curable resins generally have a low viscosity prior to curing, even in the absence of solvents. After curing, these polymer compositions exhibit thermal stability, toughness, adhesion, and solvent resistance.

The attributes of these polymer compositions also may include intractability after curing. This intractability is often the result of a curing reaction in a thermosetting resin which converts a low molecular weight precursor to a polymer network of essentially infinite molecular weight. These attributes make thermosetting resins ideal for use in the construction of circuit assemblies such as single-sided and double-sided circuits, as well as other types of surface mount technology including chip carriers, multichip modules and multilayer boards.

Exemplary compositions which have been disclosed as useful in encapsulating semiconductor devices include those taught by Eichman, et al., U.S. Pat. No. 4,632,798. Eichman, et al. disclose a molding composition comprising a melt processable thermotropic liquid crystal and polymer having a relatively low weight average molecular weight of about 4,000 to about 10,000 which is substantially incapable of further chain growth upon heating. Dispersed within the liquid crystal and polymer is approximately 40–80% by weight of a particular inorganic material (preferably silicon dioxide). Eichman, et al. address problems with prior encapsulants including the need for refrigeration prior to use and require relatively long cycle and cure times during molding.

Christie, et al., U.S. Pat. No. 5,250,848, address the solder connections used for joining an integrated semiconductor device to a carrier substrate and particularly to a structure for forming solder interconnection joints that exhibit improved fatigue life and stability. The Christie, et al. encapsulant composition contains a binder such as a cycloaliphatic polyepoxide, an inorganic filler, and optionally a surfactant.

Papathomas, et al., U.S. Pat. No. 5,471,096, discloses a method of increasing the fatigue life of solder interconnections between a semiconductor device and a supporting substrate. The Papathomas composition contains about 40 to 70% by weight bisphenyl M dicyanate and preferably 30% by weight of the $4,4^1$-ethylidene bisphenol dicyanate, and an inorganic filler. The compositions can also include a catalyst to promote the polymerization of the cyanate ester mixture.

Kohler, et al., U.S. Pat. No. 5,064,895, also teaches molding compounds of polyarylene sulfide (PAS), preferably polyphenylene sulfides (PPS) which have a low iron content and delayed crystallization and to their use as an encapsulating compound for both active and passive electronic components.

Nakai, U.S. Pat. No. 5,160,786, discloses a resin material for inserting a lead frame of a polyarylene sulfide resin; an alpha olefin copolymer graft copolymerized with an unsaturated carboxylic acid or its anhydride; and a fibrous filler, a nonfibrous inorganic filler or a mixture thereof.

However, once cured, these encapsulants form non-reworkable and intractable masses. The intractability of encapsulants has become more of a liability because of concerns about the longevity of circuit assemblies in the environments of use. Additionally, in many applications, the attachment of discrete devices, and their subsequent encapsulation is a continuing process which often requires the application of high temperatures in the circuit assembly environment. These high temperatures can char and destroy a cured encapsulant. Also, many manufacturers are taking responsibility for disposal or recycling of their products. Manufacturers may even be required to be responsible for disposal or recycling of products through government regulation.

Intractable compositions are also not compatible with the concept of disassembly for purposes of repair, disposal, or recycling, regardless of whether the thermosets are used as structural components, adhesives, or encapsulants. If, however, the compositions are designed for disassembly, it is possible that the many advantages of the thermosets can be retained without the disadvantages of intractability.

As a result, there is a need for encapsulants which provide the requisite curing properties and physical stability once cured which are at the same time reworkable so as to allow for the repair and replacement of discrete devices in the environment of an integrated circuit assembly.

SUMMARY OF THE INVENTION

In accordance with a first aspect of the invention, there is provided an encapsulated circuit assembly comprising: a chip; a substrate; at least one solder joint which spans between the chip and the substrate forming an electrically conductive connection between the chip and the substrate; and an encapsulant formed adjacent the solder joint, wherein the encapsulant comprises a thermoplastic polymer formed by ring opening polymerization of a cyclic oligomer.

BRIEF DESCRIPTION OF THE INVENTION

FIG. 1 is a schematic depiction of an exemplary flip chip assembly process.

DETAILED DESCRIPTION OF THE INVENTION

Figure 1:
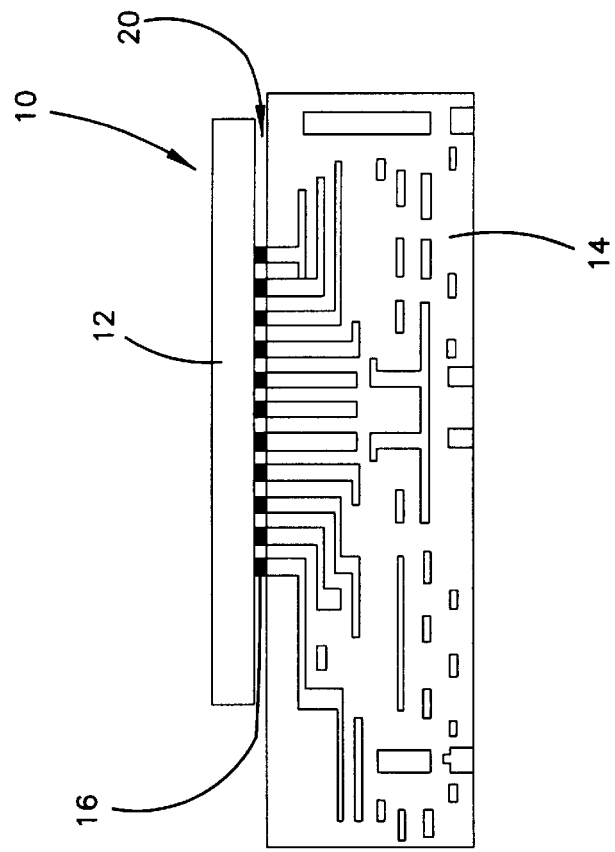
Figure 1:
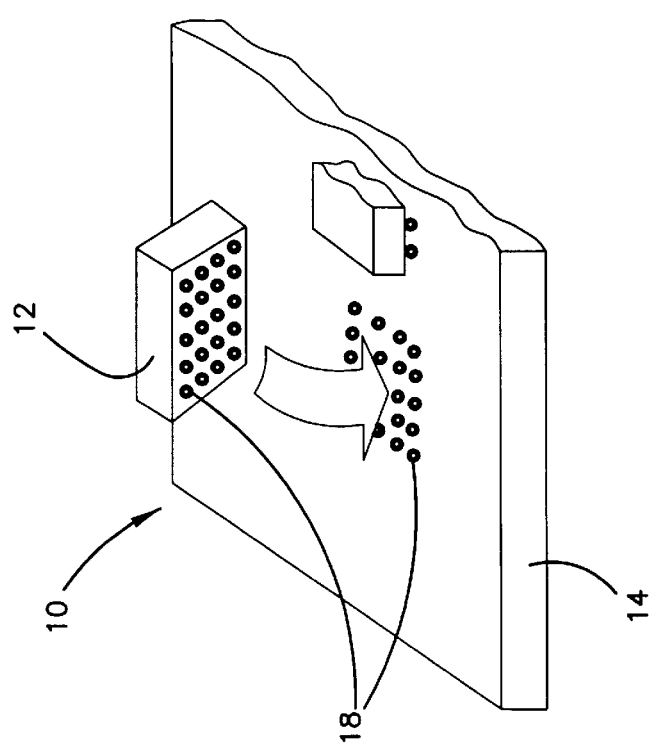

The invention is a reworkable encapsulating composition for encapsulating discrete semiconductor devices comprising a linear thermoplastic polymer composition formed by the ring opening polymerization of cyclic oligomers. The cyclic oligomer precursors are formed from the reaction of AB monomers resulting in a cyclic (AB)n oligomer where n is 4 or greater. Optionally, the composition may also comprise a filler. The cyclic oligomer precursor is applied to the semiconductor assembly and then polymerized in situ, in the assembly. Once formed, the encapsulant may be reworked by easily applied parameters.

The Encapsulant

The cyclic oligomer precursor is suitably synthesized from monomers characterized as AB monomers containing a reactive group of type A and reactive groups of type B. These monomers cyclopolymerize to afford soluble, low viscosity processable cyclic oligomers.

Various exemplary monomers which may be used to form the cyclic oligomers may be seen below in Table 1:

TABLE 1

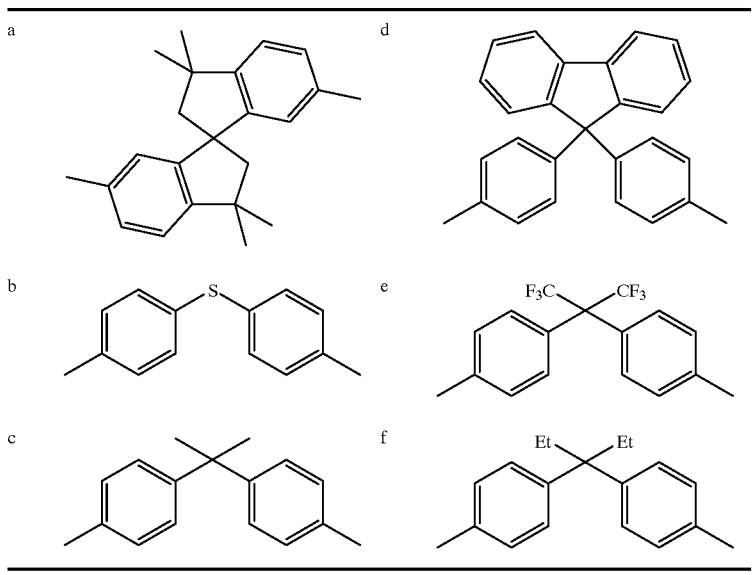

These monomers generally have reactive end groups such as carbonates, arylates, ethers and sulfides. A general formula for these monomers may be:

ARB wherein A is a reactive coupling group, B is a reactive coupling group, and R is aliphatic, alicyclic, cyclic, aryl, or heterocyclic. In specific, A and B are groups independently selected from F, Cl, Br, CN, $-NH_2$, $-CO_2H$, $-CO_2R^1$, $-C(O)R^2$, $-OH$, and $-NHC(O)R^3$ wherein $R^1$, $R^2$, and $R^3$ are each independently alkyl ($C_{1-6}$ alkyl) or aryl, (e.g. phenyl or benzyl).

The resulting polymer is a cyclic oligomer generally of (ARB)n where n is 4 or greater. One of skill in the art will appreciate having read the specification that once polymerized reactive groups A and B may be reacted and, thus, not strictly as defined above. The resulting cyclic oligomers may comprise polymers selected from the group consisting of aramides, imides, carbonates, esters, aryl ethers, and mixtures thereof.

Generally, cyclic oligomers used in the composition of the invention are preferably of low viscosity (both in solution or melt). The cyclic oligomers undergo ring opening polymerization to form thermally stable polymers suitably formed insitu, at the point of application. These polymers generally have a Tg of less than about 400° C., preferably between about 150° to 350° C. Additionally, the oligomers have a low viscosity and a high solubility. Preferred classes of monomers to form cyclic oligomers include aramides, imides, esters, carbonates, aryl ethers and, preferrably, aryl ether phenylquinoxalines.

Polymerization of the cyclic oligomer may be run until a molecular weight (Mw) of about 5,000 to 35,000 is obtained. Preferably, the decomposition temperature is greater than about 400° C. and preferably greater than about 450° C. Generally polymerization takes place in a solvent such as dimethyl formamide, N-methyl pyrididone, or any other comparable dipolar aprotic solvent. The polymerization may also take place in situ underneath the chip to be encapsulated. The ring opening polymerization generally also requires an initiator. In the case of the poly(aryl ether phenyl quinoxalines) a nucleophilic initiator is employed such as 4,4'bisphenoxide. Approximately 1 mole percent initiator is used.

Fillers

The composition of the invention may comprise an inorganic filler. Encapsulants may be filled with an inorganic powder to reduce the coefficient of thermal expansion. The optional inorganic filler can be any of the powdered solids known in the art, such as alumina, silica, zinc oxide, talc, etc. For microelectronic applications, the preferred filler is a highly purified form of silica with particle size of 25 microns or less. Generally, the amount of filler may vary but is preferred in the range of 5–50 wt % of the entire encapsulant composition.

Application and Recovery

Once polymerized, the polymer composition of the invention may be used to encapsulate any variety or number of semiconductor devices, circuit assemblies, or packaging modules. Representative assemblies include those disclosed in Ehrenberg, et al., U.S. Pat. No. 5,199,163 and Harada, et al., U.S. Pat. No. 3,801,880, both of which are incorporated herein by reference.

The invention is applicable to typical multichip assemblies such as plastic ball grid arrays, cavity plastic ball grid arrays and flip chips, tape ball grid arrays, as well as wire-bond ceramic ball grid arrays and flip chip ceramic ball grid arrays. The invention is particularly applicable to flip chips or C4 assemblies. Substrate materials used in these assemblies generally include glasses and ceramics, polyimides, alumina ceramics, epoxies, and mixtures thereof.

As can be seen in FIG. 1, an exemplary flip chip 10 connection is assembled. Flip chip interconnection was implemented to eliminate the expense, unreliability, and inefficiency of manual wire bonding. These connections are generally regarded as controlled-collapse-chip connections (or C4) where the upside down chip 12 is aligned to the substrate 14 and all joints 16 are made simultaneously between chip and substrate contacts 18 by reflowing the solder. Once the connections are formed, a space 20 is generally left between the substrate 14 and the chip 12. The solder generally comprises an electrically conductive contact between the chip 12 and substrate 14. The encapsulant may then be flowed into this space 20.

The encapsulant may be deposited from a hot melt or a high solids aqueous and organic solutions. Appropriate solvents include water, as well as organic solvents such as PM acetate, gamma butyrolactone, cyclohexanone, dimethylformamide, methyl ethyl ketone, cyclopentanone, N-methyl pyrrolidone and mixtures thereof. Ideally, the encapsulant of the invention has a solubility of about 50 gm/l to 500 gm/l.

From the hot melt, the encapsulant may simply be melted adjacent the chip and drawn into the assembly by capillary action. Preferably, the cyclic oligomer has a low viscosity once melted. If in solution, the cyclic oligomer also may be drawn into the assembly by capillary action and the solvent evaporated by heating.

The encapsulant may be reworked merely by focusing heat on the specific device to heat the thermoplastic polymer above its Tg and melt the solder. The chip can then be removed from the substrate. Normal rework temperatures range from about 250° to 400° C.

WORKING EXAMPLES

The following examples are intended to provide a non-limiting illustration of the invention.

Quinoxaline activated poly(aryl ether) synthesis of linear polymers has been demonstrated to be an efficient route for the preparation of poly(aryl ether phenylquinoxalines).

Since the AABB polymer-forming reaction involves the condensation of a bis-6-fluoro-3-quinoxaline moiety with a phenoxide, the quinoxaline activated ether synthesis was extended to the self-polymerization of an A-B monomer. The monomer structure must contain a phenolic hydroxyl group and a 6 or 7-fluoro substituent on the quinoxaline ring system to be susceptible to nucleophilic aromatic displacement. The preparation of 4-hydroxyphenyl pendant poly (phenylquinoxaline)s is well known, and the use of bis (hydroxyphenyl)phenylquinoxalines in the preparation of polyethers has been demonstrated. Preparation of 6-fluoro-2-(4-hydroxyphenyl)-3-phenylquinoxaline ("HPQ"), was accomplished by the condensation of 4-hydroxyphenyl, or a protected derivative, with 3,4-diaminofluorobenzene followed by a deprotection if necessary. This gave the desired AB monomer HPQ, which can be polymerized to high molecular weight.

An interesting feature of such A-B monomers is the possibility of forming cyclic oligomers under the appropriate conditions. As with the linear analog, stringent monomer delivery criteria to maintain the correct stoichiometry is not required in the formation of cyclic oligomers from HPQ since 1:1 stoichiometry is inherent to the monomer. The preparation of macrocyclic oligomers and their in situ transformation to linear high polymer via anionic ring opening polymerization (ROP) has been demonstrated for carbonates, aramides, imides, esters, and aryl ethers. The advantages of using cyclic oligomers as precursors of thermoplastics include low viscosity melts and controlled melt polymerizations without the release of volatile byproducts. Hay and co-workers have developed procedures to afford the macrocycles in high yield and have developed a nucleophilic initiator to produce high polymer, as disclosed in Chan et al., A.S. Macromolecules 1995, 28, 653; Chan et al., A.S. Polymer Prep. (Am. Chem. Soc. Div. Polym. Chem.), 1995, 36(2), 132; Wang et al., A.S. Polym. Prepr. (Am. Chem. Soc., Div. Polym. Chem.), 1995, 36(2), 130; Wang et al., A.S. Macromolecules 1996, 28, 6371; and Chan et al., Dissertation, McGill University, Montreal, Canada, 1995; all of which are incorporated herein by reference.

The cyclic poly(aryl ether phenylquinoxaline) was prepared via the self-polymerization of HPQ in N-methyl-2-pyrrolidone (NMP) solution containing base using a pseudo-high dilution principle as described by Brunelle and coworkers, also disclosed in Brunnelle, Ring-opening Polymerization: Mechanisms, Catalysis, Structure, Utility; Hanser: New York, 1993 which is incorporated herein by reference. Generally, cyclic oligomers are prepared in dilute conditions which favors cyclization over linear polymer formation. However, such reaction conditions are not viable in nucleophilic aromatic substitution polymerizations, since potassium fluoride, a condensation byproduct, is sufficiently soluble under these conditions and can disrupt the stoichiometry through ether interchange reactions. As a more practical means of preparing the cyclic oligomers, a different pseudo-high dilution condition, as described by Brunelle et al., was employed. In this approach, the reactants are added to the reaction flask slowly so as to minimize the concentration of reactive end groups. These conditions have been shown to generate cyclics in high yield. However, in such a reaction, the formation of cyclic oligomers should be faster than the addition rate to minimize linear polymer formation. To this end, the aryl fluoro-substituted monomer was employed since it is significantly more reactive than the aryl chloro-substituted analog.

The formation of cyclic oligomers from HPQ was carried out in the presence of potassium carbonate in a NMP/toluene solvent mixture at a 1% solids concentration. The water generated by phenoxide formation was removed as an azeotrope with toluene. It should be pointed out that the toluene content was deliberately kept low since toluene is nonpolar and reduces the polymerization rate. The reaction mixture was observed to reflux at the desired rate when the reaction was maintained at 180° C. A concentrated solution of HPQ was added to the reaction mixture over an 8 hour period. To ensure dehydration, toluene was periodically removed through the Dean-Stark trap and replaced with fresh, dry deoxygenated toluene. The reaction was allowed to proceed for an additional 24 h to ensure quantitative reaction. The solution of macrocycles were added to excess chloroform washed with water (4×), dried and concentrated.

The poly(aryl ether phenylquinoxaline) macrocycles showed a Tg of 235° C., which is approximately 10° C. lower than the linear analog. Likewise, Hay and co-workers have observed a similar depression in the glass transition temperatures for poly(aryl ether ketone) macrocycles. It should be noted, however, that the poly(aryl ether phenylquinoxaline) macrocycles did not show a true melting point, which is in direct contrast to other macrocycles. This is due to the low regioselectivity of the quinoxaline ring formation during the synthesis of HPQ, in which three distinct isomers are possible, analogous to the multiple isomeric phenylquinoxaline moieties formed in PPQ synthesis. These isomers are believed to impart the amorphous morphology to the poly(aryl ether phenylquinoxaline) macrocycle, much in the same way as they preclude crystallization in the linear analogs.

Facile ROP of the cyclic poly(aryl ether phenylquinoxaline) oligomers to form high molecular weight linear polymer was accomplished with a nucleophilic initiator, since the aryl ether linkage is activated by an electron withdrawing group (Scheme 1). For such exchange reactions, Hay and coworkers have found that potassium 4,4-bisphenoxide is the most efficient initiator for melt polymerizations (Refs. 21,22). Therefore, ROP of the aryl ether phenylquinoxaline macrocycle with 1 mole percent of initiator was performed in the melt at 300 and 350° C. Table 1 describes the characteristics of the polymers prepared including the reaction times, intrinsic viscosities and Tg's. Higher viscosities were obtained with the higher reaction temperature, however, prolonged reaction time resulted in significant gel formation.

The Tg's were high and commensurate with the high molecular weight linear polymer formation.

wherein n is usually about 4 to 8.

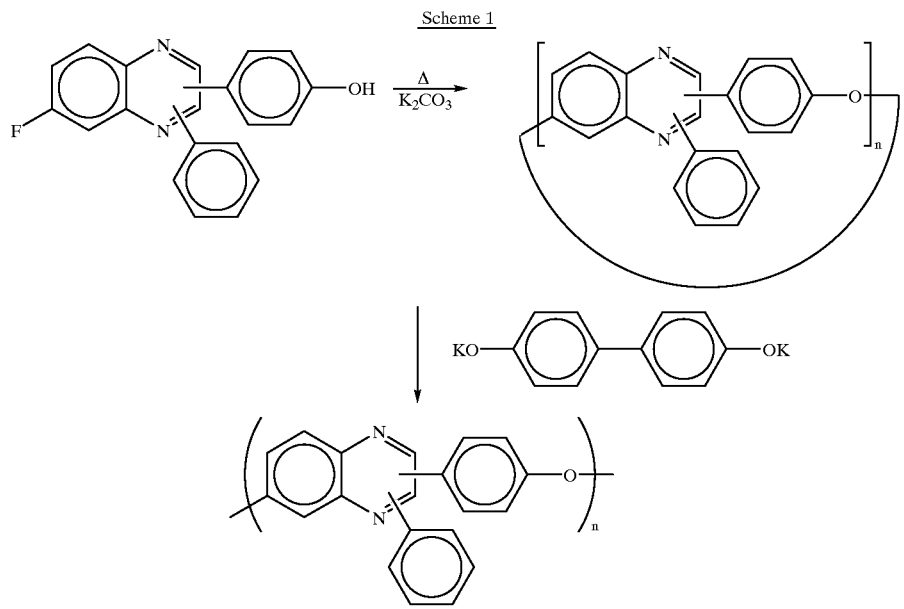

Scheme 1

TABLE 1

Characteristics of poly(aryl ether phenylquinoxaline)

| Reaction time/<br>temperature<br>(hours/° C.) | NMP<br>[η25° C.] | Tg<br>° C. |
|---|---|---|
| 300/1.5 h | dl/g | 245 |
| 350/1.5 h | 0.45 | 245 |
| 350/4 h | gcl | 245 |

These results demonstrate that quinoxaline-based poly (aryl ether) macrocycles can be synthesized through a fluoro-displacement polymerization, where the fused pyrazine ring is the activating group. The A-B monomer was condensed under pseudo high dilution conditions, where linear species were initially generated followed by cyclization to give the desired macrocycles. The regioisomers generated in the quinoxaline-ring formation were retained in the macrocycle and precluded crystallization, allowing moderate ROP temperatures (~300° C.). ROP using a nucleophilic catalyst produced linear poly(aryl ether phenylquinoxaline) of moderately high molecular weight.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An encapsulated circuit assembly comprising:
   (a) a chip;
   (b) a substrate;
   (c) at least one solder joint, wherein said solder joint spans between said chip and said substrate forming an electrically conductive connection between said chip and said substrate; and
   (d) a reworkable encapsulant formed adjacent said solder joint, wherein said encapsulant comprises a thermoplastic polymer formed by ring opening polymerization of a cyclic oligomer.

2. The assembly of claim 1, wherein said substrate comprises a material selected from the group consisting of a glass, a ceramic, a polyimide, a thermosetting resin, and mixtures thereof.

3. The assembly of claim 1, wherein said assembly comprises a flip chip.

4. The assembly of claim 1, wherein said assembly is selected from the group consisting of a plastic ball grid array, a cavity plastic ball grid array, a tape ball grid array, a wire bond ceramic ball grid array, and a flip chip ceramic ball grid array.

5. The assembly of claim 1, wherein the cyclic oligomer is a cyclic poly(aryl ether phenylquinoxaline).

6. The assembly of claim 1, wherein said polymer has a molecular weight ranging from about 5,000 to 35,000 Mw.

7. The assembly of claim 1, said thermoplastic polymer comprises a cyclic oligomer selected from the group consisting of a carbonate, an ester, an aramide, an imide, an aryl ether and mixtures thereof.

8. The assembly of claim 1 wherein said reworkable encapsulant further includes a filler.

9. The assembly of claim 8 wherein said filler is an inorganic filler.

10. The assembly of claim 9 wherein said inorganic filler is a powdered solid selected from the group consisting of alumina silica zinc oxide, talc, and mixtures thereof.

* * * * *